United States Patent
Schulz et al.

[11] Patent Number: 6,127,006
[45] Date of Patent: Oct. 3, 2000

[54] HEAT-INSULATING LAYERS ON MONOCRYSTALLINE AND POLYCRYSTALLINE METAL SUBSTRATES HAVING AN IMPROVED CRYSTALLOGRAPHIC RELATIONSHIP BETWEEN LAYER AND SUBSTRATE

[75] Inventors: Uwe Schulz, Troisdorf; Claus Kröder; Jörg Brien, both of Köln; Harmut Schurmann, Neunkirchen-Seelscheid; Uwe Kaden; Klaus Fritscher, both of Köln, all of Germany

[73] Assignee: Deutsches Zentrum fur Luft-und Raumfahrt e.V., Cologne, Germany

[21] Appl. No.: 09/165,213

[22] Filed: Oct. 2, 1998

[30] Foreign Application Priority Data

Oct. 4, 1997 [DE] Germany ............ 197 43 904

[51] Int. Cl.⁷ ................................. C23C 14/30
[52] U.S. Cl. .................. 427/585; 427/596; 427/597; 427/255.31; 427/255.32; 427/255.5
[58] Field of Search ............... 427/585, 596, 427/597, 255.31, 255.32, 255.5; 118/730

[56] References Cited

U.S. PATENT DOCUMENTS

| | | |
|---|---|---|
| 3,858,547 | 1/1975 | Bergfelt ............................ 118/49 |
| 4,010,710 | 3/1977 | Williams ........................... 118/48 |
| 4,034,704 | 7/1977 | Wossner et al. .................... 118/49 |
| 4,108,107 | 8/1978 | Scheuermann ..................... 118/730 |
| 5,074,246 | 12/1991 | Gailliard et al. ................... 118/730 |
| 5,238,752 | 8/1993 | Duderstadt et al. ................ 428/623 |
| 5,328,582 | 7/1994 | Cole ............................... 204/192.12 |
| 5,558,909 | 9/1996 | Poliquin et al. .................... 427/251 |
| 5,849,359 | 12/1998 | Burns et al. ....................... 427/242 |

FOREIGN PATENT DOCUMENTS

| | | |
|---|---|---|
| 7150351 | 6/1995 | Japan . |
| 2318589 | 4/1998 | United Kingdom . |

OTHER PUBLICATIONS

Great Britain Patent Office search report dated Nov. 24, 1998.

*Primary Examiner*—Timothy Meeks
*Attorney, Agent, or Firm*—Baker Botts L.L.P.

[57] ABSTRACT

The present invention relates to a method for coating monocrystalline or polycrystalline metal substrates with a ceramic heat-insulating layer of zirconia by electron-beam vapor deposition, and to a method for coating turbine blades made of Ni-based superalloys. The method is characterized in that the metal substrate is moved during the vapor deposition in terms of a superposition of two rotational motions around horizontal axes, but in essentially perpendicular directions.

8 Claims, 2 Drawing Sheets

200 Polar Figure

HEAT-INSULATING LAYERS ON MONOCRYSTALLINE AND POLYCRYSTALLINE METAL SUBSTRATES HAVING AN IMPROVED CRYSTALLOGRAPHIC RELATIONSHIP BETWEEN LAYER AND SUBSTRATE

BACKGROUND OF THE INVENTION

1. Field of the Invention

The present invention relates to a method for coating monocrystalline or polycrystalline metal substrates with a ceramic heat-insulating layer of zirconia by electron-beam vapor deposition, and to a method for coating turbine blades made of Ni-based superalloys.

2. Description of the Related Art

In order to reduce thermal losses in turbines and especially in turbine blades with interior cooling and thus to increase the efficiency of turbines, the turbine components are provided with heat-insulating layers. The method of electron-beam vapor deposition of Y partially stabilized zirconia (YPSZ) which is performed at a substrate temperature of about 1000° C. has proven particularly effective for this purpose.

However, the life of the heat-insulating layers on their substrates is limited by the occurrence of supercritical stresses between metal substrate and ceramic layer. Accordingly, all measures for prolonging the life of such layers must always be directed to keeping these stresses as long as possible in the subcritical range. The stresses are not necessarily highest during the operation of the turbine because the application of the heat-insulating layers is effected at comparable temperatures and under stress-free conditions. However, they grow higher in the course of turbine operation, especially through the oxidation of the metallic adhesive layer which is situated between the metal substrate and the ceramic layer. When the turbine is turned off, the heat-insulating layers and the underlying metal substrates (e.g., turbine blades) cool down with thermal contraction. When the temperature is decreased from 1000° C. to room temperature, the contraction is about 1.6% for Ni alloys and only 1.08%, on average, for heat-insulating layers made of YPSZ. The expansion coefficient of YPSZ is known to be anisotropic [H. Schubert: Anisotropic thermal expansion coefficient of $Y_2O_3$-stabilized tetragonal zirconia, J. Am. Ceram. Soc. 69 (1986) 3, p. 270–271]; it is higher along the c axis than along the a axis.

SUMMARY OF THE INVENTION

It has been the object of the present invention to improve the adhesion of Y partially stabilized zirconia on metal substrates over that found in the prior art. A comparison between our own measurements on layers in a casual <110> direction and on isotropic material reveals the slightly higher lateral expansion of vapor-deposited layers. This is due to the contribution of those YPSZ portions which are oriented along the c axis. This anisotropy is already an advantage of the vapor-deposited layers because of the slightly higher expansion as compared to that of isotropic material, when employed on nickel alloys which are known to exhibit an even higher expansion.

Figure 1:
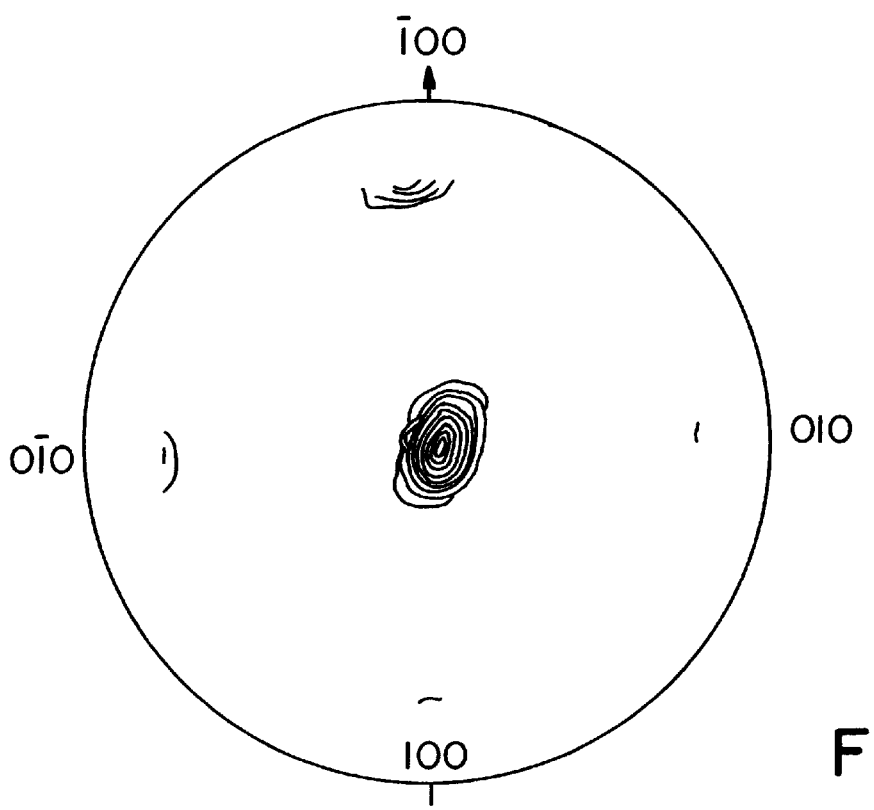
FIG. 1 is a polar figure of a texture generated by deposition.

The orientation of monocrystalline Ni alloys is not yet important here, since their expansion coefficient is isotropic. However, a factor which is even more important to the generation of stresses than the anisotropy of thermal expansion is the anisotropy of the modulus of elasticity in nickel and zirconia. It has been found that the anisotropy of the modulus of elasticity in the substrate and YPSZ and the intelligent mutual orientation of the crystallographic directions of the two partners, to be thus demanded, play the key role.

DETAILED DESCRIPTION OF PREFERRED EMBODIMENTS

In a first embodiment, the above object is achieved by a method for coating monocrystalline or polycrystalline metal substrates with a ceramic heat-insulating layer of zirconia by electron-beam vapor deposition, characterized in that the metal substrate is moved during the vapor deposition in terms of a superposition of two rotational motions around horizontal axes, but in essentially perpendicular directions. Preferably, the heat-insulating layers according to this invention will be partially stabilized zirconia, the stabilization being provided by the inclusion of rare earth metal oxides such as yttria, ytterbia, scandia or ceria, typically in the range of 1–20 mole %.

In the case of a turbine blade having an elongated design, for example, this means a simultaneous rotation around the horizontal principal axes, i.e., around the axes corresponding to the highest and lowest moments of inertia of the component. In other words, if the turbine blade is placed along a horizontal plane, the horizontal principal axes would be the axis which runs the length of the blade and the axis which is perpendicular thereto, both of which lie principally within the horizontal plane.

According to Hooke's law for the calculation of elastic stresses, $$\sigma = E \cdot \epsilon,$$

where
   $\sigma$ represents the stress,
   E represents the modulus of elasticity, and
   $\epsilon$ represents the elastic deformation.

Thus, in a concrete case, if the modulus of elasticity is high, the stress will also be correspondingly high when an elastic displacement is effected by a constant amount. Thus, in the particular case of a material pairing of monocrystalline Ni-based superalloy/heat-insulating layer, if the difference between the moduli of elasticity is high, the stress between the two partners will be correspondingly high for an elastic expansion or a change in temperature. In a realistic technical case, for example, a monocrystalline turbine blade, which has been solidified in <100> direction as a rule, will undergo vapor deposition with YPSZ ceramics all around while rotating in the same orientation in the coating recipient as well. As is well-known in the prior art [D. V. Rigney, R. Viguie, D. J. Wortman, D. W. Skelly: PVD thermal barrier applications and process development for aircraft engines. NASA conference publication 3312 (1995) p. 135–149], the ceramic crystals grow onto the substrate in a texturized manner in <100> direction, perpendicular to the rotational axis. According to our own studies, which support the above result, the crystals will also grow in a highly anisotropic manner in a lateral direction when rotationally vapor-deposited. According to studies by U. Schulz [U. Schulz, H.

Oettel, W. Bunk: Texture of EB-PVD Thermal Barrier Coatings Under Variable Deposition Conditions. Z. Metallkd. 87 (1996) 6, p. 488–492], a <100> direction forms, parallel to the rotational axis. The appearance of such texture which is generated by such a layer is shown in the polar figure in FIG. 1. The direction of the arrow indicates the direction of the rotational axis. The <100> direction of the layer texture runs in the same direction.

Assuming that the metal substrate was a sheet of monocrystalline Ni-based superalloy with orientation, as usual with turbine blades, in its <100> direction of growth which rotates around that axis during the coating, and that the (010) face was selected as the sheet face in addition, the following crystal relationships will apply:

For the planes $(100)_{Ni\ alloy}\ 2\ (100)_{heat\text{-}insulating\ layer}$

For the directions $<100>_{Ni\ alloy}\ 2\ (100)_{heat\text{-}insulating\ layer}$ $<110>_{Ni\ alloy}\ 2\ <110>_{heat\text{-}insulating\ layer}$.

The moduli of elasticity are known to be highly anisotropic. With components of monocrystalline Ni-based superalloys, this is already taken into account in the prior art. Although the anisotropy of the moduli of elasticity is known for zirconia crystals [R. P. Ingel, D. Lewis, III: Elastic anisotropy in zirconia single crystals. J. Am. Ceram. Soc. 71 (1988) 4, p. 265–271], it has as yet not been utilized or taken into account for industrial manufacturing. Now, when turbine blades made of monocrystalline Ni-based superalloys are subjected to electron-beam vapor deposition with zirconia in a rotational mode by attaching them to a horizontal axis, the following moduli of elasticity which have been detected for a monocrystalline compact material will have to be compared in the principal crystal orientations which can be encountered here:

TABLE 1

| crystal direction | Ni single crystal | YPSZ |
| --- | --- | --- |
| <100> | 130 GPa | 360 GPa |
| <110> | 220 GPa | 200 GPa |
| <111> | 290 GPa | 160 GPa |

Thus, in the most unfavorable case, there will be a difference in the moduli of elasticity by a factor of 2.8 as shown in the following Table. An optimum factor would be 1. This case cannot be realized for physical reasons. By turning the direction of the layer texture by 45°, the factor can be reduced to a value of 1.5 as can be seen from Table 2.

TABLE 2

| | | |
| --- | --- | --- |
| <001> direction of growth of the nickel-based superalloy modulus of elasticity | 130 GPa | factor between the different moduli of elasticity of zirconia and the nickel alloy |
| <001> zirconia on a substrate rotating in a conventional way during the coating modulus of elasticity | 360 GPa | 2.8 |
| <011> zirconia (turned laterally by 45°b 05263974.01) on substrate modulus of elasticity | 200 GPa | 1.5 |

Now, if the sample is rotated not only around its horizontal rotational axis during the vapor deposition, but is also given an additional component of motion according to the invention during the vapor deposition such that an additional rotational motion around a horizontal axis with the same angular velocity proceeds which is essentially at a right angle to the former, a resultant direction of movement is generated which is displaced by 45° as compared to the former.

Figure 2:
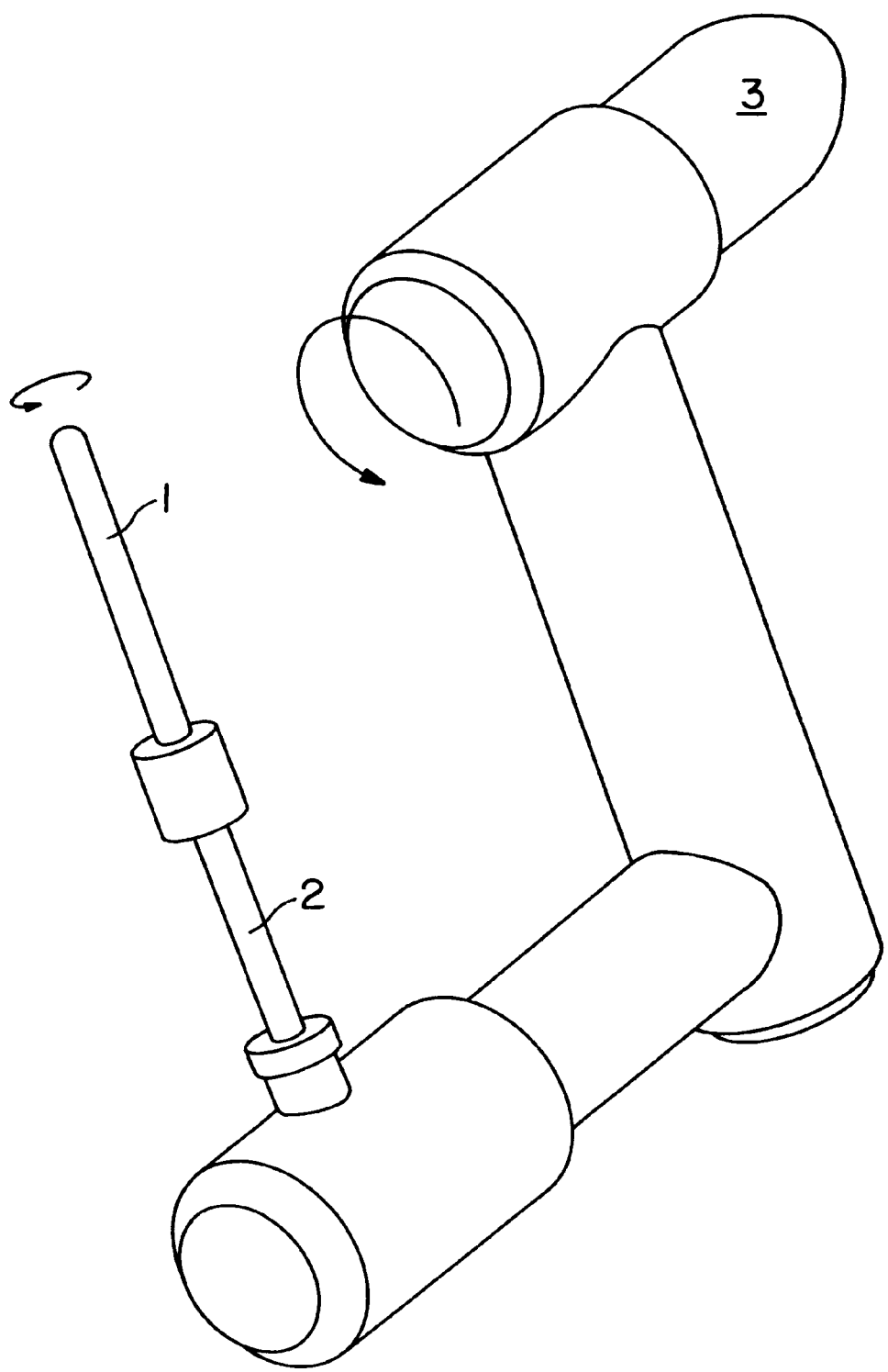
FIG. 2 depicts the electron-beam vapor deposition of heat-insulating layers with an improved lateral texture by means of superposed motion patterns.

FIG. 2 depicts the electron-beam vapor deposition of heat-insulating layers with an improved lateral texture by means of superposed motion patterns.

Substrate (1) which is here shaped like a rod is subjected to vapor deposition with the material emitting from the underlying evaporation source due to rotation around sliding and rotational shaft (3) and rotation around rotational axis (2).

Consequently, in this way, a zirconia layer with a direction of texture which is displaced by 45° can also be deposited on components. Such displacement by 45° has been effected experimentally under the mentioned conditions according to the invention. As a rule, this coating mode means simultaneous rotation around the two horizontal principal axes of the component, which in many cases correspond to the highest and lowest moments of inertia.

Figure 3:
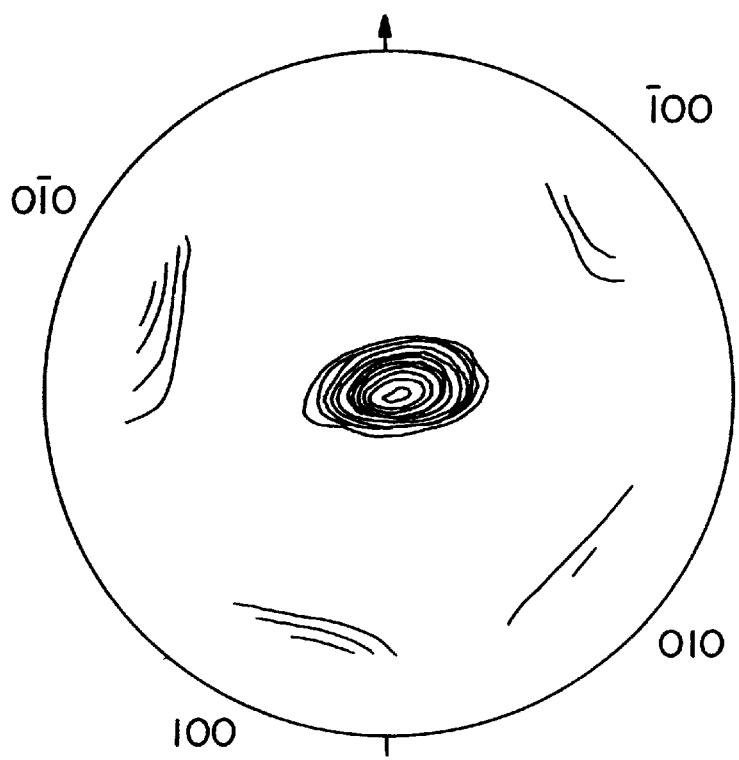
FIG. 3 polar figure of a texture generated by deposition.

According to the invention, it has now been found that the superimposed directions of motion must not necessarily result in a resultant direction of rotation which is displaced by precisely 45°, i.e., the angular velocities of the superimposed rotational motions need not be exactly identical in order to achieve a rotation of the lateral layer texture from orientation in the <100> to the <010> direction. Thus, in further experiments, the ratio between the angular velocities of the principal axis and the perpendicularly acting rotational motion was increased by more than a factor of 10 in one experimental run, a higher rotational speed of the principal axis (=sliding and rotational shaft (3)) of 12 rpm having been set. FIG. 3 depicts a corresponding polar figure. As compared to FIG. 1, this actually involves a rotation of the direction of orientation by 45°. The broadness of the reflections of the polar figure now achieved has increased in this case which indicates that the mutual crystallographic orientation of the individual crystals has assumed a lower amount of order in this case. Accordingly, in a particular embodiment of the invention, it is preferred to set the angular velocities of the two rotational motions equal or different.

To achieve as uniform as possible a heat-insulating layer, it is preferred according to the invention to keep the ratio between the angular velocities of the two rotational motions constant during the vapor deposition.

Another possible way, in principle, to a more favorable coupling between the materials in view of optimizing the agreement between the moduli of elasticity of monocrystalline nickel alloy and electron-beam vapor-deposited heat-insulating layer would be to prepare the monocrystalline substrates in (111) orientation rather than (100) orientation. Although, according to general knowledge, this would decrease the creep resistance of the substrates in the direction of the maximum creep stresses occurring during operation, it would do so to a small extent which is still acceptable. However, the advantage of such an orientation would be double: at one hand, a higher stiffness of the turbine blades which also favors a longer life of the ceramic layers, and at the other hand, their more favorable orientation with respect to the direction of texture of the heat insulating layer, i.e., $<111>_{Ni\ alloy}\ 2\ (100)_{heat\text{-}insulating\ layer}$.

This convergence in directions is even accompanied by a difference between the moduli of elasticity by a factor of only 1.25.

Another embodiment of the present invention consists in utilizing the established crystal growth technology for turbine blades in a conventional way and to coat these components, solidified as monocrystals, with the heat-insulating layers applied according to the invention which form a <110> texture in the direction of the <100> principal axis of the components. This solution according to the invention is free of additional cost, i.e., it has the advantage that already established industrial coating devices can be utilized which allow the coating of components according to the technology herein described without the need to perform additional changes in equipment or to do further investments.

The low modulus of elasticity of the component in <100> direction, which is particularly manifested in vibrations and/or due to longitudinal extension under tensile stress, is altogether accepted. However, the ceramic layer on the component, altered according to the invention, can bear the dimensional changes better, due to its lower modulus of elasticity in this principal direction, since the stresses between the component and the ceramic layer are lower now.

What is claimed is:

1. A method for coating a monocrystalline or polycrystalline metal part with a uniform heat-insulating layer of zirconia by electron-beam vapor deposition, so forming a <110> texture of the zirconia layer parallel to a <100> principal axis of the part and minimizing a modulus of elasticity between the zirconia layer and the part, wherein, during vapor deposition, the metal part is moved in a first rotational motion about a first axis at a first angular velocity, and a second rotational motion about a second axis at a second angular velocity, said first axis and said second axis being substantially perpendicular; wherein the first and second angular velocities are substantially equal.

2. The method according to claim 1, wherein a ratio between said first and second angular velocities is constant during the vapor deposition.

3. The method according to claim 2, wherein the metal part is a polycrystalline turbine blade.

4. A method for coating a monocrystalline or polycrystalline metal substrate with a ceramic heat-insulating layer comprising:

rotating the metal substrate about a first axis of rotation at a first angular velocity and simultaneously rotating the metal substrate about a second axis of rotation at a second angular velocity, said first axis and said second axis being substantially perpendicular and the first and second angular velocities being substantially equal; and applying the ceramic heat-insulating layer through physical vapor deposition to the rotating metal substrate.

5. The method of claim 4 wherein the ceramic heat-insulating layer is applied through electron-beam vapor deposition.

6. The method of claim 4 wherein the monocrystalline or polycrystalline metal substrate comprises Ni-based superalloy and the ceramic heat-insulating layer comprises zirconia.

7. The method of claim 4 wherein a ratio of said first angular velocity to the second angular velocity remains constant while the ceramic heat-insulating layer is being applied.

8. The method of claim 4 wherein said first and second angular velocities are maintained such that the ceramic heat-insulating layer is applied to minimize a difference in a modulus of elasticity of the metal substrate and a modulus of elasticity of the ceramic heat-insulating layer.

* * * * *